(12) United States Patent
Sano et al.

(10) Patent No.: US 11,887,871 B2
(45) Date of Patent: Jan. 30, 2024

(54) SUBSTRATE PROCESSING APPARATUS AND SUBSTRATE PROCESSING METHOD

(71) Applicant: Tokyo Electron Limited, Tokyo (JP)

(72) Inventors: Kazushige Sano, Koshi (JP); Yuichi Tanaka, Koshi (JP); Yoshihiro Kai, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 241 days.

(21) Appl. No.: 16/942,018

(22) Filed: Jul. 29, 2020

(65) Prior Publication Data

US 2021/0035825 A1 Feb. 4, 2021

(30) Foreign Application Priority Data

Jul. 30, 2019 (JP) ................................ 2019-140207

(51) Int. Cl.
*H01L 21/67* (2006.01)
*H01L 21/66* (2006.01)

(52) U.S. Cl.
CPC .. *H01L 21/67086* (2013.01); *H01L 21/67057* (2013.01); *H01L 21/67248* (2013.01); *H01L 22/30* (2013.01)

(58) Field of Classification Search
None
See application file for complete search history.

(56) References Cited

U.S. PATENT DOCUMENTS

2018/0158701 A1* 6/2018 Hyakutake ........ H01L 21/67757

FOREIGN PATENT DOCUMENTS

| JP | H04-357835 | A | 12/1992 | |
|---|---|---|---|---|
| JP | 2012-216778 | A | 11/2012 | |
| JP | 2018-133558 | A | 8/2018 | |
| JP | 2019-125692 | A | 7/2019 | |
| WO | WO2018/185938 | * | 10/2018 | ............... F24D 3/18 |

* cited by examiner

*Primary Examiner* — Alexander G Ghyka
(74) *Attorney, Agent, or Firm* — Pearne & Gordon LLP

(57) ABSTRACT

A substrate processing apparatus includes a processing tub configured to store therein a processing liquid in which multiple substrates are to be immersed; multiple liquid supplies each of which includes a supply line through which the processing liquid is supplied to an inside of a water tank of the processing tub and a heating device configured to heat the processing liquid at a portion of the supply line; and multiple in-tank temperature sensors configured to measure a temperature of the processing liquid at multiple positions within the water tank of the processing tub.

16 Claims, 10 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-140207 filed on Jul. 30, 2019, the entire disclosure of which is incorporated herein by reference.

TECHNICAL FIELD

The various aspects and embodiments described herein pertain generally to a substrate processing apparatus and a substrate processing method.

BACKGROUND

A substrate processing apparatus described in Patent Document 1 includes a processing tub, a circulation line, a pump, a heater, at least two temperature sensors, and a controller. The processing tub stores therein a processing liquid in which a substrate is to be immersed. The circulation line returns the processing liquid overflown from the processing tub back into the processing tub. The pump, the heater and one of the two temperature sensors are provided on the circulation line. The other temperature sensor is provided within a water tank within the processing tub. The controller controls a heating amount of the heater based on detection temperatures of the at least two temperature sensors.

Patent Document 1: Japanese Patent Laid-open Publication No. 2018-133558

SUMMARY

In an exemplary embodiment, a substrate processing apparatus includes a processing tub configured to store therein a processing liquid in which multiple substrates are to be immersed; multiple liquid supplies each of which includes a supply line through which the processing liquid is supplied to an inside of a water tank of the processing tub and a heating device configured to heat the processing liquid at a portion of the supply line; and multiple in-tank temperature sensors configured to measure a temperature of the processing liquid at multiple positions within the water tank of the processing tub.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
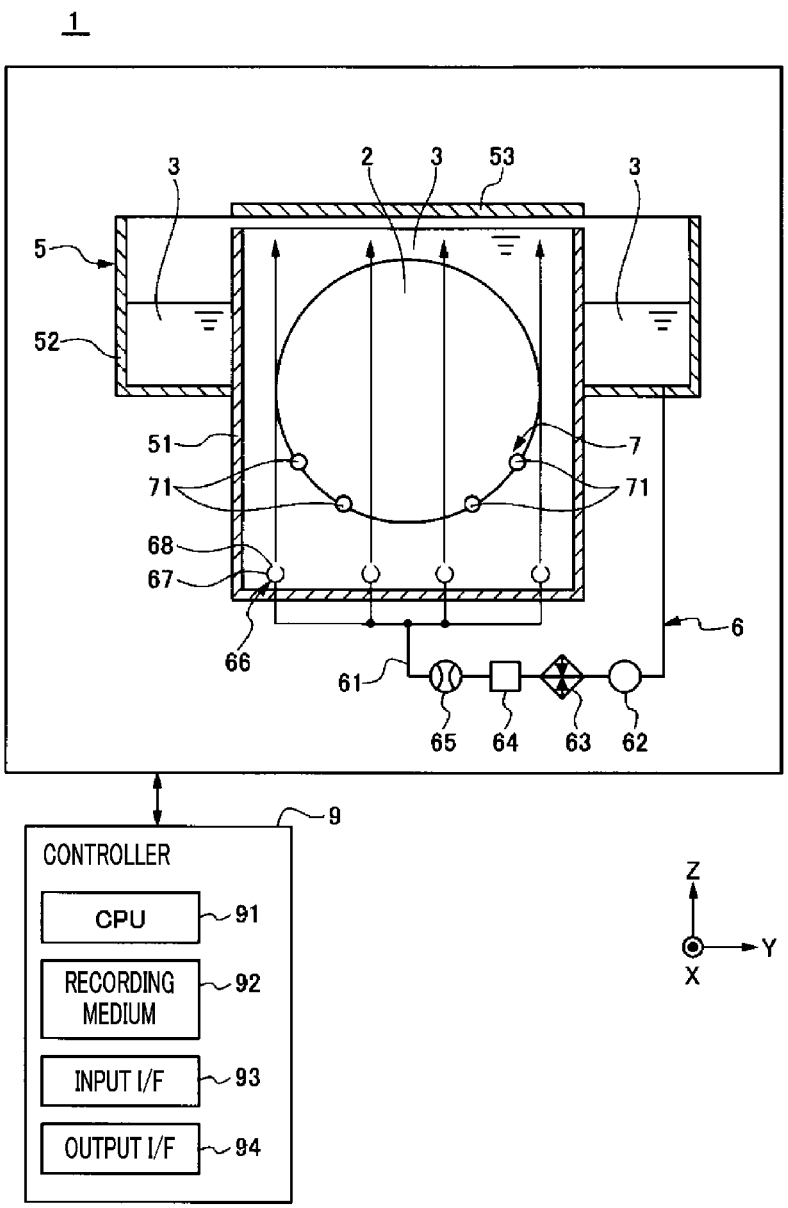
FIG. 1 is a front cross sectional view illustrating a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same or corresponding parts will be assigned same reference numerals, and redundant description may be omitted. In the following description, the X-axis direction, the Y-axis direction and the Z-axis direction are orthogonal to each other, and the X-axis and Y-axis directions are horizontal directions whereas the Z-axis direction is a vertical direction.

FIG. 1 is a front cross sectional view illustrating a substrate processing apparatus according to an exemplary embodiment. The substrate processing apparatus 1 is of a batch type configured to process a plurality of substrates 2 by immersing them in a processing liquid 3. The substrate processing apparatus 1 includes a processing tub 5. The processing tub 5 stores the processing liquid 3 therein, and the substrates 2 are processing by being immersed in the processing liquid 3 within a water tank of the processing tub 5.

Each substrate 2 includes, by way of example, a silicon wafer, a silicon oxide film and a silicon nitride film. The silicon oxide film and the silicon nitride film are alternately stacked on top of each other repeatedly, thus forming a stacked film. The stacked film has an opening formed through it in a thickness direction thereof.

The processing liquid 3 is, for example, an etching liquid for use in etching the substrates 2. The processing liquid 3 may be, by way of non-limiting example, a phosphoric acid aqueous solution and is maintained in a boiling state within the water tank of the processing tub 5. This processing liquid enters the opening of the stacked film and selectively etches and removes the silicon nitride film among the silicon oxide film and the silicon nitride film.

The processing tub 5 is, for example, a dual tub, and includes an inner tub 51 configured to store the processing liquid 3 therein and an outer tub 52 configured to collect the processing liquid 3 overflown from the inner tub 51. The outer tub 52 surrounds an upper portion of the inner tub 51.

Though a lower portion of the inner tub 51 is located at an outside of the outer tub 52 in FIG. 1, it may be located inside the outer tub 52. That is, the outer tub 52 may accommodate the inner tub 51 therein.

The substrates 2 are immersed in and processed by the processing liquid 3 within the water tank of the inner tub 51. A cover 53 may be disposed above the inner tub 51 to keep the processing liquid 3 warm while suppressing scattering of the processing liquid 3.

The substrate processing apparatus 1 is equipped with a liquid supply 6 configured to supply the processing liquid 3 into the water tank of the processing tub 5. The liquid supply 6 has a supply line 61 through which the processing liquid 3 flows. The supply line 61 may be a flow path through which the processing liquid 3 supplied from an outside of the processing tub 5 is replenished into the processing tub 5. In the present exemplary embodiment, however, the supply line 61 is a circulation path through which the processing liquid 3 overflown from the processing tub 5 is returned back into the processing tub 5. By way of example, the circulation path is configured to return the processing liquid 3 extracted from the outer tub 52 into the inner tub 51. Accordingly, the processing liquid 3 can be reused.

The liquid supply 6 is equipped with a liquid feeding device 62, a heating device 63, a heating temperature sensor 64 and a flowmeter 65 at a portion of the supply line 61. The liquid feeding device 62 may be, by way of example, but not limitation, a pump and is configured to send the processing liquid 3. The heating device 63 is, for example, an electric heater and configured to heat the processing liquid 3. The heating temperature sensor 64 is configured to measure a temperature of the processing liquid 3 at a downstream of the heating device 63. An output variation of the heating device 63 is immediately reflected on a measurement value of the heating temperature sensor 64. The heating temperature sensor 64 may be disposed near the heating device 63 to improve responsiveness to the output variation of the heating device 63. The flowmeter 65 is configured to measure a flow rate of the processing liquid 3 at a downstream of the liquid feeding device 62. An output variation of the liquid feeding device 62 is immediately reflected on a measurement value of the flowmeter 65.

The liquid supply 6 has, at a leading end of the supply line 61, a nozzle 66 configured to discharge the processing liquid 3 into the water tank of the processing tub 5. The nozzle 66 discharges the processing liquid 3 into, for example, the water tank of the inner tub 51. The nozzle 66 may discharge a mixed fluid of the processing liquid 3 and a gas. By way of example, nozzles 66A and 66B shown in FIG. 2A have a L-shape and include vertical pipes 69A and 69B and horizontal pipes 67A and 67B horizontally extending from lower ends of the vertical pipes 69A and 69B, respectively.

As illustrated in FIG. 1, a horizontal pipe 67 is a hollow rod extending under the substrates 2 in an arrangement direction of the substrates 2 (X-axis direction), and the number of the horizontal pipe 67 is plural and these horizontal pipes 67 are arranged at a regular distance therebetween in the Y-axis direction. Each of the horizontal pipes 67 has a multiple number of discharge openings 68 arranged at a regular distance therebetween in a lengthwise direction of the horizontal pipe 67, and the processing liquid 3 is discharged directly upwards from each of these multiple discharge openings 68. Accordingly, a curtain-shaped upflow is formed within the water tank of the inner tub 51.

The substrate processing apparatus 1 is equipped with a substrate holder 7 configured to hold the plurality of substrates 2. The substrate holder 7 includes a plurality of substrate holding rods 71 arranged at a regular distance therebetween in a circumferential direction to hold an edge of the substrate 2; and a non-illustrated connection plate connected to one ends of the individual holding rods 71. Each of the plurality of holding rods 71 extends from the connection plate in the X-axis direction, that is, the arrangement direction of the substrates 2, and has a multiple number of holding grooves arranged at a regular distance therebetween in a lengthwise direction of the holding rod 71. The holding rods 71 hold the substrate 2 vertically in the holding grooves thereof.

The substrate holder 7 is configured to be moved up and down between a standby position and a processing position. The standby position is a position where the plurality of substrates 2 are transferred to a non-illustrated transfer device, and is set to be located above the processing position. The processing position is a position where the substrates 2 are immersed in the processing liquid 3.

The substrate holder 7 receives, at the standby position, the substrates 2 to be processed from the transfer device, and is then moved down to the processing position. After a lapse of a predetermined time, the substrate holder 7 is raised back to the standby position and, at the standby position, the substrate holder 7 hands over the substrates 2 after being processed to the transfer device. Thereafter, the same operations are repeated.

When the substrate holder 7 is moved up, the cover 53 is opened not to interfere with the substrate holder 7. Meanwhile, when the substrate holder 7 is stopped at the standby position or the processing position, the cover 53 is closed. By closing the cover 53, the processing liquid 3 can be kept warm and scattering of the processing liquid 3 can be suppressed.

The controller 9 is, by way of example, a computer and includes, as depicted in FIG. 1, a CPU (Central Processing Unit) 91 and a recording medium 92 such as a memory. The recording medium 92 stores therein a program for controlling various processings performed in the substrate processing apparatus 1. As the CPU 91 executes the program stored in the recording medium 92, the controller 9 controls an operation of the substrate processing apparatus 1. Further, the controller 9 is equipped with an input interface 93 and an output interface 94. The controller 9 receives a signal from the outside through the input interface 93 and transmits a signal to the outside through the output interface 94.

This program is recorded in, for example, a computer-readable recording medium and is installed from this recording medium to the recording medium 92 of the controller 9. The computer-readable recording medium may be, by way of example, but not limitation, a hard disk (HD), a flexible disk (FD), a compact disk (CD), a magnet optical disk (MO), a memory card, or the like. Further, the program may be installed to the recording medium 92 of the controller 9 by being downloaded from a server through Internet.

Figure 2A:
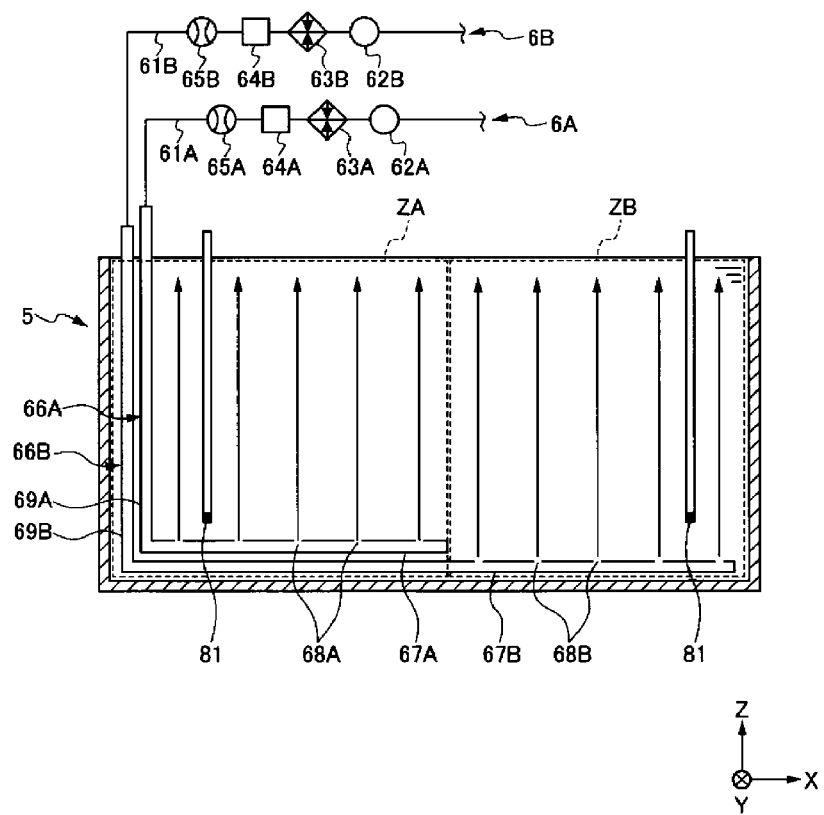
FIG. 2A is a side cross sectional view illustrating a layout of a plurality of liquid supplies and a plurality of in-tank temperature sensors according to the exemplary embodiment.
Figure 2B:
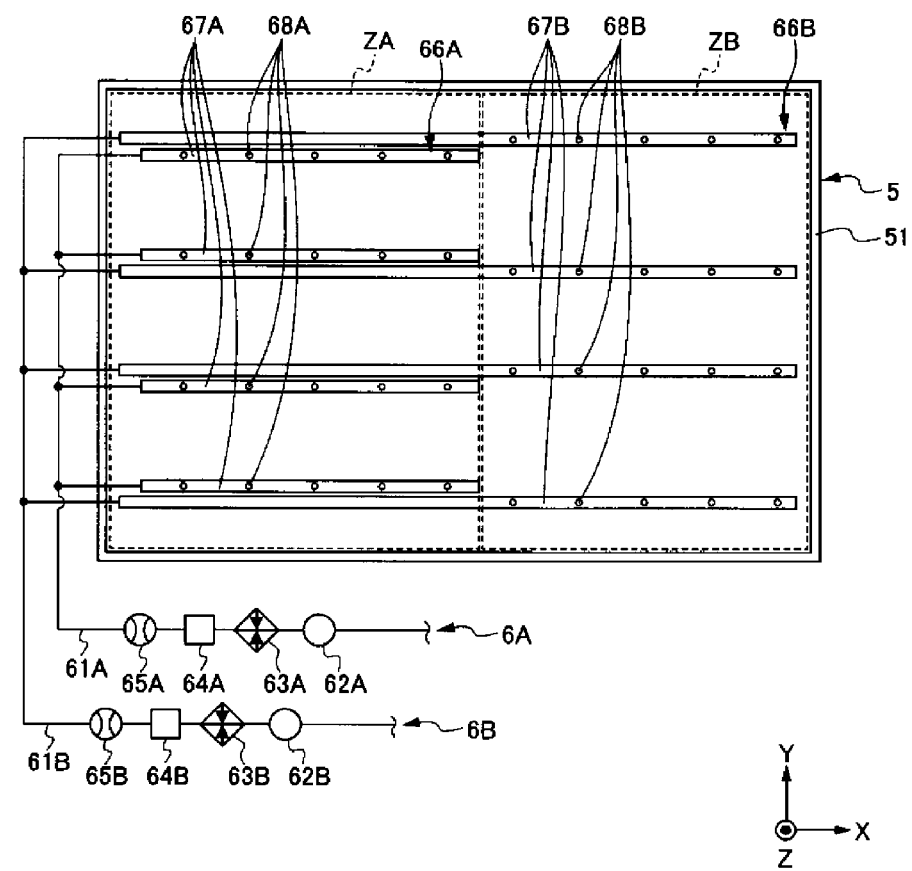
FIG. 2B is a plan view illustrating a layout of horizontal pipes of each of the plurality of liquid supplies shown in FIG. 2A.

FIG. 2A is a side cross sectional view illustrating a layout of a plurality of liquid supplies and a plurality of in-tank temperature sensors according to the exemplary embodiment. FIG. 2B is a plan view illustrating a layout of horizontal pipes of the plurality of liquid supplies shown in FIG. 2A.

The substrate processing apparatus 1 includes a plurality of liquid supplies 6A and 6B, and each of the liquid supplies 6A and 6B includes a heating device 63. Since an output of the heating device 63 of each of the liquid supplies 6A and 6B can be adjusted individually, a temperature distribution within the water tank of the inner tub 51 can be easily adjusted. Here, the temperature within the water tank of the inner tub 51 may be simply referred to as "in-tank temperature."

After the temperature of the processing liquid 3 is adjusted in the liquid supplies 6A and 6B, the processing liquid 3 is supplied into the water tank of the inner tub 51, and is then overflown from the inner tub 51 and collected into the outer tub 52 shown in FIG. 1. The processing liquid 3 is mixed in a water tank of the outer tub 52, so that the temperature of the processing liquid 3 is uniformed.

Thus, the plurality of liquid supplies 6A and 6B may draw the processing liquid 3 from the same position of the outer tub 52. In such a case, a common line connecting a single outlet port of the outer tub 52 and the supply line 61 of each of the liquid supplies 6A and 6B is provided.

Here, however, the plurality of liquid supplies 6A and 6B may draw the processing liquid 3 from different positions of the outer tub 52. In this case as well, if each of the plurality of liquid supplies 6A and 6B includes the heating device 63, the output of the heating device 63 of each of the liquid supplies 6A and 6B can be adjusted individually, so that a temperature distribution within the water tank can be adjusted easily.

Furthermore, the substrate processing apparatus 1 is equipped with the plurality of in-tank temperature sensors 81 and measures the temperature of the processing liquid 3 at multiple positions within the water tank of the inner tub 51. An in-tank temperature distribution can be calculated based on measurement values of these in-tank temperature sensors 81.

The in-tank temperature distribution is calculated as data in which a position of each of measurement points of the plurality of in-tank temperature sensors 81 and a measurement value at the measurement point are matched. The position of the measurement point is previously stored in the recording medium 92 and retrieved when used.

The in-tank temperature distribution may further include data in which a position of a prediction point other than the measurement point and a prediction value at the prediction point are matched. The prediction point may be set to be located between the plurality of measurement points, or may be set to be a point other than the plurality of measurement points. The prediction value may be calculated by a general prediction method such as, but not limited to, interpolation or extrapolation.

Though the in-tank temperature distribution is a distribution in a horizontal direction in the present exemplary embodiment, it may be a distribution in a vertical direction or a distribution in both of the horizontal direction and vertical direction. Further, the in-tank temperature distribution may be any of a one-dimensional distribution, a two-dimensional distribution and a three-dimensional distribution.

According to the present exemplary embodiment, since the in-tank temperature distribution is calculated based on the measurement values of the plurality of in-tank temperature sensors 81, it is possible to perform a manipulation of allowing an actual distribution to approach a target distribution. As a result, controllability of the in-tank temperature can be improved.

As depicted in FIG. 2B, when viewed from the top, the inside of the water tank of the inner tub 51 is divided into a first zone ZA and a second zone ZB, and the liquid supplies 6A and 6B are disposed to discharge the processing liquid 3 into the first zone ZA and the second zone ZB, respectively. A boundary between the adjacent zones ZA and ZB is an imaginary line. Though the inside of the water tank of the inner tub 51 is divided into the two zones ZA and ZB in an arrangement direction of the substrates 2 in FIG. 2B, the inside of the water tank of the inner tub 51 may be divided into more than two zones.

The plurality of zones ZA and ZB are divisions of the inside of the water tank of the inner tub 51 in, for example, the arrangement direction (X-axis direction) of the substrates 2, as mentioned above. The plurality of substrates 2 can be sorted into a plurality of groups in the arrangement direction thereof, and a processing condition for the substrates 2 can be adjusted for each of the groups individually. In case that there is a processing fault in the substrates 2 of a certain group, the processing condition for the substrates 2 of this group can be changed. Therefore, a yield can be improved.

The first liquid supply 6A includes a first supply line 61A, a first liquid feeding device 62A, a first heating device 63A, a first heating temperature sensor 64A, a first flowmeter 65A and a first nozzle 66A. The first nozzle 66A has a first horizontal pipe 67A and first discharge openings 68A. Further, the first nozzle 66A also has a first vertical pipe 69A.

The horizontal pipe 67A is a hollow rod extending in the arrangement direction (X-axis direction) of the substrates 2. The horizontal pipe 67A may be plural in number, and these horizontal pipes 67A may be arranged at a regular distance therebetween in the Y-axis direction. The first discharge openings 68A are provided in the first zone ZA without being provided in the second zone ZB. That is, the first liquid supply 6A discharges the processing liquid 3 into the first zone ZA and does not discharge the processing liquid 3 into the second zone ZB.

Likewise, the second liquid supply 6B includes a second supply line 61B, a second liquid feeding device 62B, a second heating device 63B, a second heating temperature sensor 64B, a second flowmeter 65B, and a second nozzle 66B. The second nozzle 66B includes a second horizontal pipe 67B and second discharge openings 68B. Further, the second nozzle 66B also has a second vertical pipe 69B.

The second horizontal pipe 67B is a hollow rod extending in the arrangement direction (X-axis direction) of the substrates 2. The second horizontal pipe 67B may be plural in number, and these second horizontal pipes 67B may be arranged at a regular distance therebetween in the Y-axis direction. The second discharge openings 68B are provided in the second zone ZB without being provided in the first zone ZA. That is, the second liquid supply 6B discharges the processing liquid 3 into the second zone ZB and does not discharge the processing liquid 3 into the first zone ZA.

As stated above, the plurality of liquid supplies 6A and 6B are disposed to discharge the processing liquid 3 into the zones ZA and ZB, respectively. The liquid supply (for example, the liquid supply 6A) configured to discharge the processing liquid 3 into one zone (for example, the zone ZA) and the liquid supply (for example, the liquid supply 6B) configured to discharge the processing liquid 3 into the other zone (for example, the zone ZB) need not to be completely same.

By way of example, the plurality of liquid supplies 6A and 6B are disposed not to discharge the processing liquid 3 into the plurality of zones ZA and ZB in duplicates. Each of the plurality of liquid supplies 6A and 6B discharges the processing liquid 3 into a different one of the plurality of zones ZA and ZB. Only one liquid supply (for example, the first liquid supply 6A) discharges the processing liquid into the same zone (for example, the first zone ZA).

As described above, if the different liquid supplies 6 discharge the processing liquid 3 for the zones ZA and ZB individually, the temperature of the processing liquid 3 can be adjusted for each of the zones ZA and ZB, so that a distribution of the in-tank temperature in the horizontal direction can be adjusted easily.

One or more (one in FIG. 2A) in-tank temperature sensors 81 may be provided in each of the zones ZA and ZB. Accordingly, the distribution of the in-tank temperature in the horizontal direction can be measured. Further, it is also possible to adjust a heating temperature for the processing liquid 3 while monitoring the in-tank temperature of the processing liquid 3 for each of the zones ZA and ZB.

Figure 3:
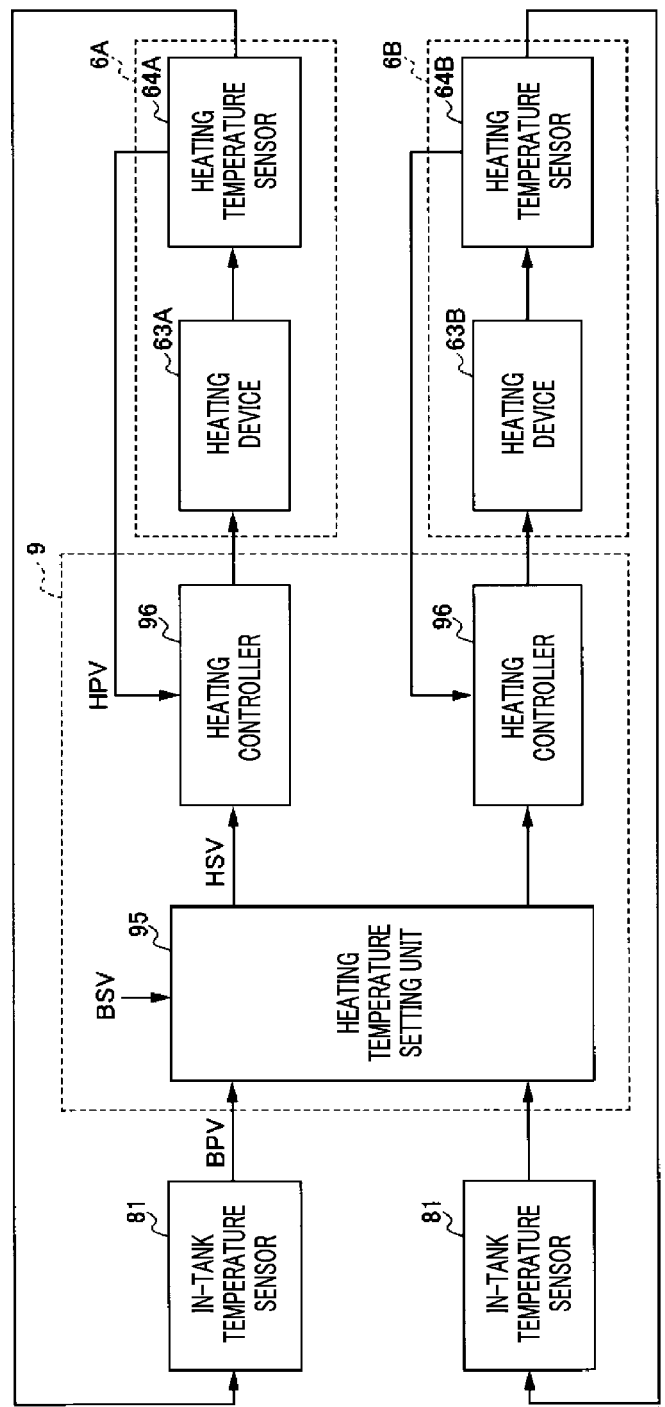
FIG. 3 is a functional block diagram illustrating constituent components of a controller according to the exemplary embodiment.

FIG. 3 is a functional block diagram illustrating constituent components of the controller according to the exemplary embodiment. Each functional block shown in FIG. 3 is conceptual and need not necessarily be physically configured as shown in FIG. 3. All or a part of the functional blocks may be functionally or physically dispersed or combined on a unit. All or a part of processing functions performed in the respective functional blocks may be implemented by a program performed in the CPU or implemented by hardware through a wired logic. The same applies to FIG. 5 to be described later.

As shown in FIG. 3, the controller 9 includes a heating temperature setting unit 95 and a heating controller 96. The heating temperature setting unit 95 calculates the in-tank temperature distribution based on measurement values BPV of the plurality of in-tank temperature sensors 81, and sets a target value HSV of the heating temperature of the processing liquid 3 by the heating device 63 based on the calculated distribution. The heating controller 96 controls the heating device 63 based on the target value HSV of the heating temperature.

The heating temperature setting unit 95 calculates the in-tank temperature distribution based on the measurement values BPV of the plurality of in-tank temperature sensors 81, and sets the target value HSV of the heating temperature of the processing liquid 3 by the heating device 63 based on a deviation between the actually calculated distribution and a target distribution. The target value HSV is calculated through an operation to render the deviation zero. In this operation, a PI operation, a PID operation, or the like may be used.

The target distribution of the in-tank temperature is previously stored in the recording medium 92 and retrieved when used. The target distribution of the in-tank temperature may be a uniform distribution or a non-uniform distribution, and is appropriately updated based on an inspection result of the substrates 2 after being processed with the processing liquid 3. The target distribution of the in-tank temperature is decided so that a processing fault of the substrates 2 can be reduced. The target distribution may be set to be a non-uniform distribution on purpose.

As stated above, the heating temperature setting unit 95 sets the target value HSV of the heating temperature of the heating device 63 based on the deviation of the actual distribution of the in-tank temperature and the target distribution thereof. Therefore, the actual distribution of the in-tank temperature is made to be coincident with the target distribution, so that the processing fault of the substrates 2 can be reduced.

The heating temperature setting unit 95 may set the common target value HSV for all the liquid supplies 6. In the present exemplary embodiment, the target value HSV may be set for each liquid supply 6. To elaborate, the heating temperature setting unit 95 calculates a deviation between the measurement value BPV and the target value BSV thereof within the first zone ZA, and sets the target value HSV of the heating temperature of the processing liquid 3 by the first heating device 63A based on the calculated deviation. Further, the heating temperature setting unit 95 calculates a deviation between the measurement value BPV and the target value BSV thereof within the second zone ZB, and sets the target value HSV of the heating temperature of the processing liquid 3 by the second heating device 63B based on the calculated deviation. Since the heating temperature of the processing liquid 3 can be adjusted for each liquid supply 6, the in-tank temperature distribution can be adjusted easily.

In the configuration in which the heating temperature setting unit 95 sets the target value HSV for each liquid supply 6, the heating controller 96 is provided for each liquid supply 6.

The heating controller 96 controls the heating device 63 based on the deviation between the target value HSV of the heating temperature and the measurement value HPV of the heating temperature sensor 64. The heating controller 96 controls an output of the heating device 63 to make zero the deviation between the target value HSV and the measurement value HPV. For an operation of the output, a PI operation, a PID operation, or the like may be used, for example.

A time taken until an output variation of the heating device 63 is reflected on the measurement value HPV of the heating temperature is shorter than a time taken until the output variation of the heating device 63 is reflected on the measurement value BPV of the in-tank temperature. Accordingly, if the target value HSV of the heating temperature is corrected based on the deviation between the target value BSV of the in-tank temperature and the measurement value BPV thereof and if the output of the heating device 63 is controlled based on the deviation between the target value HSV of the heating temperature and the measurement value HPV thereof, responsiveness can be improved, so that the measurement value BPV of the in-tank temperature can be made equal to the target value BSV in a short time.

The control shown in FIG. 3 is a so-called cascade control. In the cascade control, a single feedback loop is composed of a master loop and a slave loop. In the cascade control shown in FIG. 3, the target value HSV of the heating temperature is corrected so that the deviation between the target temperature BSV and the measurement value BPV of the in-tank temperature becomes zero, and the output of the heating device 63 is controlled such that the deviation between the target value HSV and the measurement value HPV of the heating temperature becomes zero.

Figure 4:
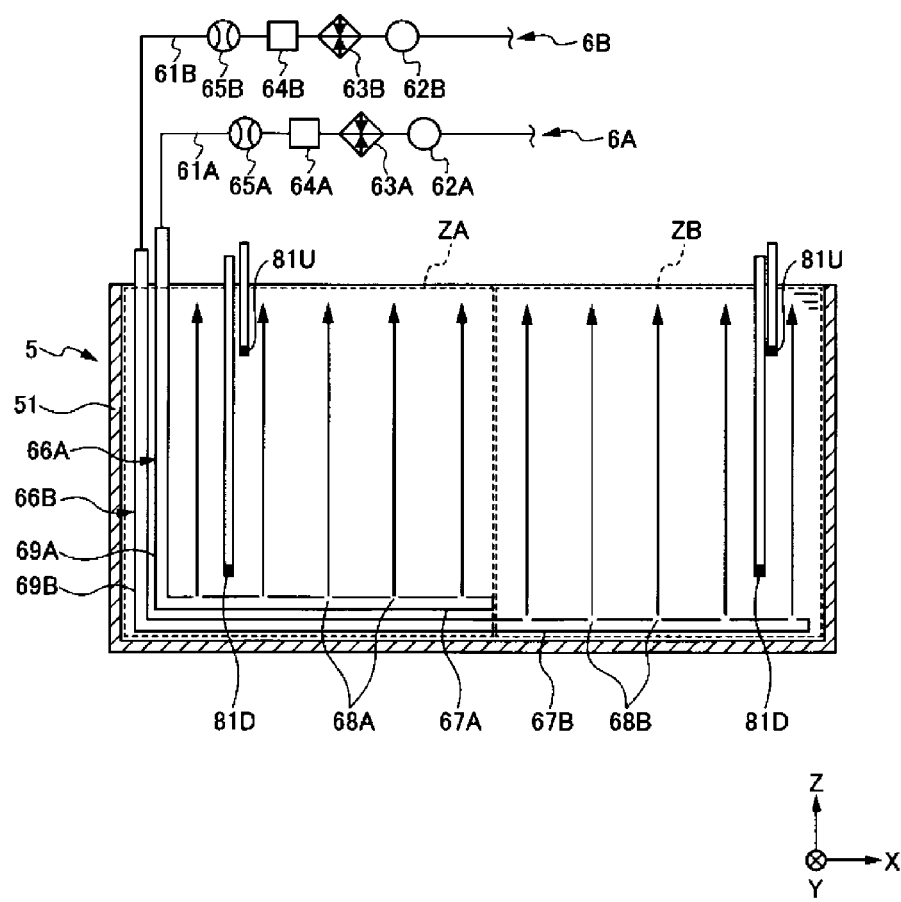
FIG. 4 is a side cross sectional view illustrating a layout of a plurality of liquid supplies and a plurality of in-tank temperature sensors according to a first modification example.

FIG. 4 is a side cross sectional view illustrating a layout of the plurality of liquid supplies and a plurality of in-tank temperature sensors according to a first modification example. Since a plan view illustrating a layout of the horizontal pipes of the present modification example is the same as FIG. 2B, illustration thereof is omitted. Hereinafter, distinctive features of the present modification example from the above-described exemplary embodiment will be mainly discussed.

In the present modification example, a plurality of in-tank temperature sensors 81D and 81U are arranged at a regular distance therebetween in a vertical direction in a plurality of zones ZA and ZB, respectively. Thus, a distribution of an in-tank temperature in the vertical direction can be calculated for each of the plurality of zones ZA and ZB, so that it is possible to perform a manipulation of allowing the distribution of the in-tank temperature in the vertical direction to approach a target distribution.

The distribution of the in-tank temperature in the vertical direction can be adjusted by controlling a flow rate of the processing liquid 3 which is discharged vertically upwards from the horizontal pipe 67. Since the opening area of the discharge openings 68 is constant, a flow velocity of the processing liquid 3 becomes higher as the flow rate of the processing liquid 3 increases, and it is difficult for the processing liquid 3 to be deprived of heat until it reaches a liquid surface after being discharged from the discharge openings 68. Thus, the larger the flow rate of the processing liquid 3 is, the smaller a difference of the in-tank temperature in the vertical direction is.

The substrate processing apparatus 1 is equipped with the plurality of liquid supplies 6, and each of the plurality of liquid supplies 6 has the liquid feeding device 62. Since outputs of the liquid feeding devices 62 of the respective liquid supplies 6 can be adjusted individually, the distribution of the in-tank temperature in the vertical direction can be adjusted easily.

The in-tank temperature sensors 81D and 81U are disposed above the horizontal pipe 67, and the in-tank temperature sensor 81D at a lower side is closer to the horizontal pipe 67 than the in-tank temperature sensor 81U at an upper side. For the reason, a time taken for an output variation of the heating device 63 to be reflected on a measurement value HPV of the in-tank temperature sensor 81D at the lower side is shorter than a time taken for the output variation of the heating device 63 to be reflected on a measurement value HPV of the in-tank temperature sensor 81U at the upper side.

Though the heating temperature setting unit 95 shown in FIG. 3 may acquire a measurement value BPV of the in-tank temperature from the in-tank temperature sensor 81U at the upper side, it may acquire the measurement value BPV of the in-tank temperature from the in-tank temperature sensor 81D at the lower side to improve responsiveness. The heating temperature setting unit 95 may calculate a deviation between the measurement value BPV of the in-tank temperature sensor 81D at the lower side and a target value BSV thereof, and set a target value HSV of the heating temperature of the processing liquid 3 by the heating device 63 based on the calculated deviation.

Figure 5:
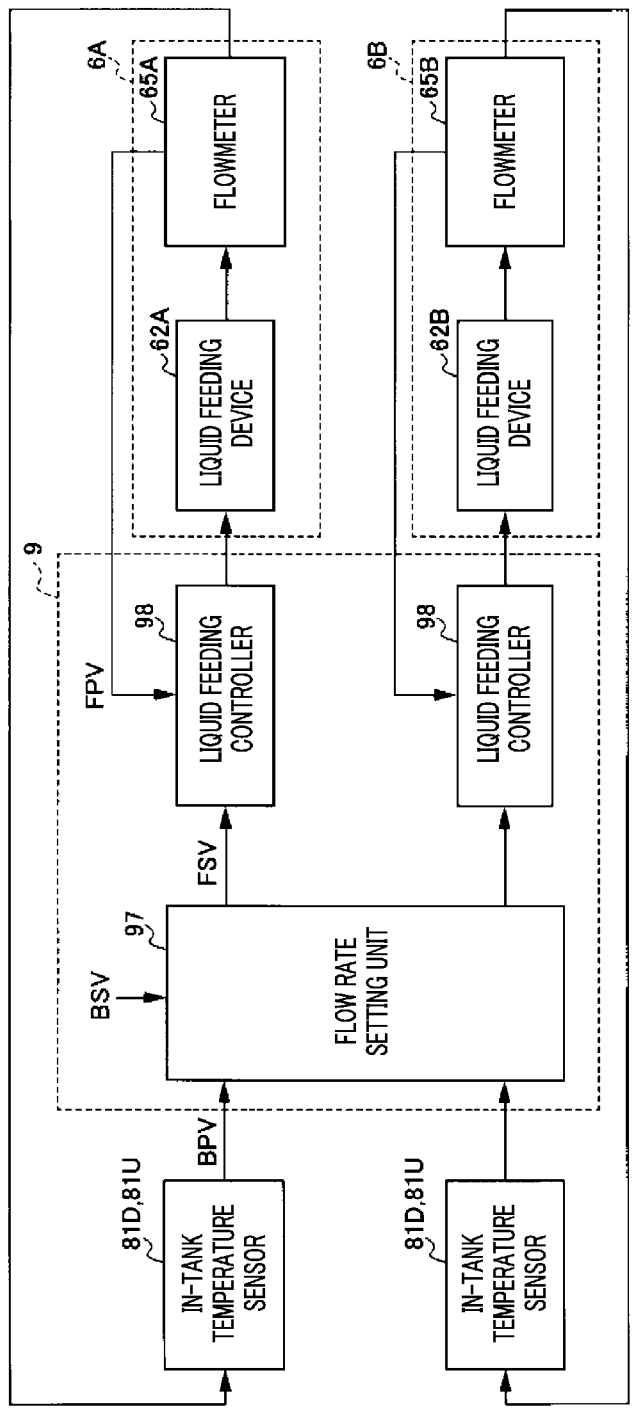
FIG. 5 is a functional block diagram illustrating constituting components of a controller according to the first modification example.

Meanwhile, a flow rate setting unit 97 shown in FIG. 5 may acquire measurement values BPV of the in-tank temperature from both the in-tank temperature sensor 81D at the lower side and the in-tank temperature sensor 81U at the upper side.

FIG. 5 is a functional block diagram illustrating constituent components of a controller according to the first modification example. Functional blocks shown in FIG. 5 may be used in combination with the functional blocks shown in FIG. 3, or may be used alone.

As depicted in FIG. 5, a controller 9 includes the flow rate setting unit 97 and a liquid feeding controller 98. The flow rate setting unit 97 calculates a distribution of the in-tank temperature in the vertical direction based on the measurement values BPV of the plurality of in-tank temperature sensors 81D and 81U, and sets a target value FSV of the flow rate of the processing liquid 3 by the liquid feeding device 62 based on the calculated distribution of the in-tank temperature in the vertical direction. The distribution of the in-tank temperature in the vertical direction is represented by, for example, a temperature gradient (a temperature variation per a unit length) in the vertical direction. The liquid feeding controller 98 controls the liquid feeding device 62 based on the target value FSV of the flow rate.

The flow rate setting unit 97 calculates the distribution of the in-tank temperature in the vertical direction based on the measurement values BPV of the plurality of in-tank temperature sensors 81D and 81U, and sets the target value FSV of the flow rate of the processing liquid 3 by the liquid feeding device 62 based on a deviation between the calculated distribution and a target distribution. The target value FSV is calculated through an operation to render the deviation zero. In this operation, a PI operation, a PID operation, or the like may be used.

Since the flow rate setting unit 97 sets the target value FSV of the flow rate of the liquid feeding device 62 based on the deviation between the actual distribution of the in-tank temperature in the vertical direction and the target distribution thereof, the actual distribution of the in-tank temperature in the vertical direction can be made to be coincident with the target distribution, so that a processing fault of the substrates 2 can be reduced.

Though the flow rate control unit 97 may set a common target value FSV for all the liquid supplies 6, the target value FSV is set for each of the liquid supplies 6 individually in the present exemplary embodiment. To elaborate, the flow rate setting unit 97 calculates a deviation between a distribution in the vertical direction in the first zone ZA and a target distribution thereof, and sets a target value FSV of the flow rate of the processing liquid 3 by the first liquid feeding device 62A based on this calculated deviation. Further, the flow rate setting unit 97 calculates a deviation between a distribution in the vertical direction in the second zone ZB and a target distribution thereof, and sets a target value FSV of the flow rate of the processing liquid 3 by the second liquid feeding device 62B based on this calculated deviation. Since the flow rate of the processing liquid 3 can be adjusted for each of the liquid supplies 6 individually, the distribution of the in-tank temperature in the vertical direction can be adjusted easily.

In case that the flow rate setting unit 97 sets the target value FSV for each of the liquid supplies 6 individually, the liquid feeding controller 98 is provided for each liquid supply 6.

The liquid feeding controller 98 controls the liquid feeding device 62 based on the deviation between the target value FSV of the flow rate and a measurement value FPV of the flowmeter 65. The liquid feeding controller 98 controls an output of the liquid feeding device 62 to allow the deviation between the target value FSV and the measurement value FPV to become zero. By way of non-limiting example, a PI operation, a PID operation, or the like may be used for this calculation of the output of the liquid feeding device 62.

A time taken until an output variation of the liquid feeding device 62 is reflected on the measurement value FPV of the flow rate is shorter than a time taken until the output variation of the liquid feeding device 62 is reflected on the measurement value BPV of the in-tank temperature. Accordingly, if the target value FSV of the flow rate is corrected based on the deviation between the actual distribution of the in-tank temperature in the vertical direction and the target distribution thereof and, also, if the output of the liquid feeding device 62 is controlled based on the deviation of the target value FSV and the measurement value FPV of the flow rate, responsiveness can be bettered, so that the measurement value BPV of the in-tank temperature can be made to be coincide with the target value BSV in a short time.

The control shown in FIG. 5 is a so-called cascade control. In the cascade control, a single feedback loop is composed of a master loop and a slave loop. In the cascade control shown in FIG. 5, the target value FSV of the flow rate is corrected so that the deviation between the distribution of the in-tank temperature in the vertical direction and the target distribution thereof becomes zero, and the output of the liquid feeding device 62 is controlled such that the deviation between the target value FSV and the measurement value FPV of the flow rate becomes zero.

Figure 6A:
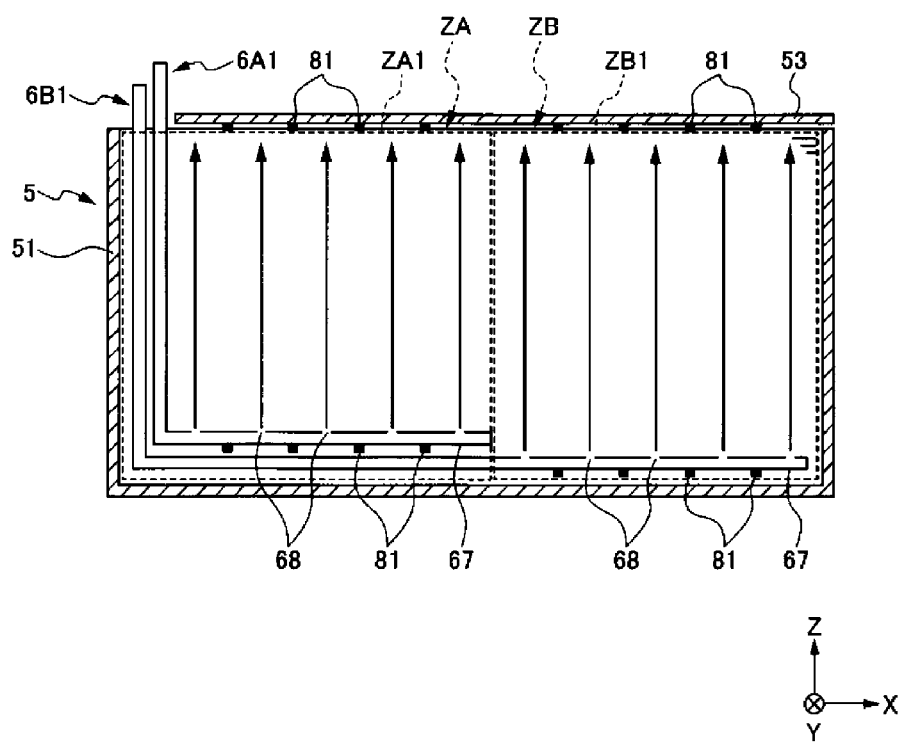
FIG. 6A is a side cross sectional view illustrating a layout of a plurality of liquid supplies and a plurality of in-tank temperature sensors according to a second modification example.
Figure 6B:
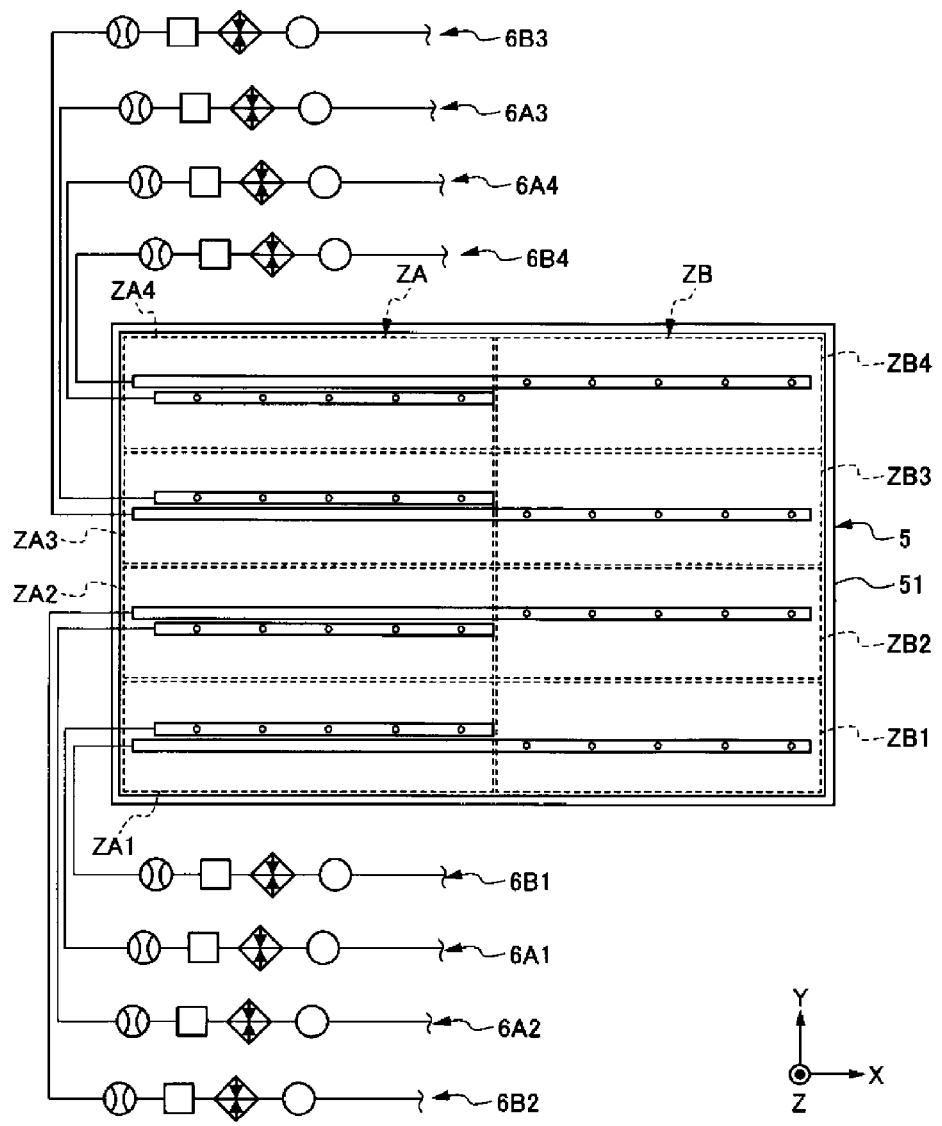
FIG. 6B is a plan view illustrating a layout of the plurality of liquid supplies shown in FIG. 6A.

FIG. 6A is a side cross sectional view illustrating a layout of a plurality of liquid supplies and a plurality of in-tank temperature sensors according to a second modification example. FIG. 6B is a plan view illustrating the layout of the plurality of liquid supplies shown in FIG. 6A. Hereinafter, distinctive features of the present modification example from the above-described exemplary embodiment and the first modification example will be mainly discussed.

As depicted in FIG. 6A, in-tank temperature sensors 81 may be mounted to the horizontal pipe 67 of the liquid supply 6. In this case, an additional member for supporting the in-tank temperature sensors 81 is not necessary. Further, since the horizontal pipe 67 is disposed under the substrates 2 which are immersed in the processing liquid 3, the in-tank temperature sensors 81 can be arranged two-dimensionally within a horizontal plane under the substrates 2. Therefore, a temperature distribution within the horizontal plane under the substrates 2 can be calculated.

Furthermore, the in-tank temperature sensors 81 may be mounted to the cover 53. In this case as well, an additional member for supporting the in-tank temperature sensors 81 is not required. Further, since the cover 53 is located above the substrates 2 which are immersed in the processing liquid 3, the in-tank temperature sensors 81 can be arranged two-dimensionally within a horizontal plane above the substrates 2. Therefore, a temperature distribution within the horizontal plane above the substrates 2 can be calculated.

Further, the in-tank temperature sensors 81 may be two-dimensionally arranged at both the horizontal pipe 67 and the cover 53. In this case, since both the temperature distribution within the horizontal plane under the substrates 2 and the temperature distribution within the horizontal plane above the substrates 2 can be obtained, it is possible to calculate a three-dimensional temperature distribution within the water tank.

In addition, it is also possible that the three-dimensional temperature distribution within the water tank can be calculated from measurement values of the in-tank temperature sensors 81 which are mounted to a member other than the horizontal pipe 67 and the cover 53.

As illustrated in FIG. 6B, when viewed from the top, the inside of the water tank of the inner tub 51 may be divided into a multiple number of zones ZA1, ZA2, ZA3, ZA4, ZB1, ZB2, ZB3 and ZB4 in the arrangement direction (X-axis direction) of the substrates 2 and a direction (Y-axis direction) orthogonal thereto. That is, the inside of the water tank of the inner tub 51 is divided into a plurality of zone groups ZA and ZB in the X-axis direction, and these zone groups ZA and ZB may be further divided into a multiple number of zones in the Y-axis direction. The zone group ZA is divided into the zones ZA1, ZA2, ZA3 and ZA4, and the zone group ZB is divided into the zones ZB1, ZB2, ZB3 and ZB4.

A plurality of liquid supplies 6A1, 6A2, 6A3, 6A4, 6B1, 6B2, 6B3 and 6B4 are disposed to discharge the processing liquid 3 into the zones ZA1, ZA2, ZA3, ZA4, ZB1, ZB2, ZB3 and ZB4, respectively. The liquid supply (for example, the liquid supply 6A1) configured to discharge the processing liquid 3 into any one zone (for example, the zone ZA1) and the liquid supply (for example, the liquid supply 6A2) configured to supply the processing liquid 3 into any one of the other zones (for example, the zone ZA2) need not to be completely same.

As stated above, when viewed from the top, the inside of the water tank is divided into the plurality of zone groups ZA and ZB in the arrangement direction of the substrates 2, and the different liquid supplies 6 discharge the processing liquid 3 into these zone groups ZA and ZB individually. Therefore, the substrates 2 can be sorted into multiple groups in the arrangement direction thereof, and a processing condition for the substrates 2 can be adjusted for each group. In case that there is a processing default of the substrates 2 of a certain group, the processing condition for the substrates 2 belonging to this group can be changed, so that a yield can be improved.

Further, as described above, when viewed from the top, the inside of the water tank (for example, the zone group ZA) is divided into the multiple zones ZA1, ZA2 and ZA3 in the direction orthogonal to the arrangement direction of the substrates 2, and the different liquid supplies 6 discharge the processing liquid 3 into these zones. Therefore, a single sheet of substrate 2 can be divided into multiple regions in the direction orthogonal to the arrangement direction of the substrates 2, and a processing condition for the substrate 2 can be set for each of the multiple regions individually. In case that there is a processing default in a certain region of this single sheet of substrate 2, the processing condition for that region of the substrate 2 can be changed, so that the yield can be improved. This effect is also obtained when the inside of the water tank of the inner tub 51 is divided into the multiple zones only in the direction orthogonal to the arrangement direction of the substrates 2.

In the present modification example, the number of division of the zones is larger than those in the above-described exemplary embodiment and the above-described first modification example. However, the present modification example is identical to the exemplary embodiment and the first modification example in that the in-tank temperature is controlled for zones individually. Therefore, the control shown in FIG. 3 or FIG. 5 is applicable to the present modification example as well.

When viewed from the top, one or more in-tank temperature sensors 81 are disposed in each of the multiple zones ZA1, ZA2, ZA3, ZA4, ZB1, ZB2, ZB3 and ZB4. Accordingly, a distribution of the in-tank temperature in the horizontal direction can be measured. Further, it is possible to adjust the heating temperature of the processing liquid 3 by the heating device 63 while monitoring the in-tank temperature of the processing liquid 3 for each of the zones ZA1, ZA2, ZA3, ZA4, ZB1, ZB2, ZB3 and ZB4 individually.

In a configuration in which multiple in-tank temperature sensors 81 are arranged in each single zone at a regular distance therebetween in the horizontal direction, one measurement value selected from these in-tank temperature sensors 81 may be used for the control of the heating temperature of the processing liquid 3 by the heating device 63. Though the way to select the in-tank temperature sensors 81 is not particularly limited, one located closest to a place where a processing default of the substrates 2 occurs, and it may be appropriately updated based on an inspection result of the substrates 2. Further, an average of measurement values of the individual in-tank temperature sensors 81 may be used for the control of the heating temperature of the processing liquid 3 by the heating device 63.

Furthermore, at least one set of in-tank temperature sensors 81 is disposed in each of the multiple zones ZA1, ZA2, ZA3, ZA4, ZB1, ZB2, ZB3 and ZB4. The one set of in-tank temperature sensors 81 include a plurality of in-tank temperature sensors 81 arranged at a regular distance therebetween in the vertical direction. With this configuration, a distribution of the in-tank temperature in the vertical direction can be measured. Further, it is possible to adjust the flow rate of the processing liquid 3 by the liquid feeding device 62 for each of the zones ZA1, ZA2, ZA3, ZA4, ZB1, ZB2, ZB3 and ZB4 individually while monitoring the distribution of the in-tank temperature in the vertical direction therein.

In case that multiple sets of in-tank temperature sensors 81 are arranged at a regular distance therebetween in the horizontal direction in the single zone, a measurement value of one set selected from the multiple sets may be used for the control of the flow rate of the processing liquid 3 by the liquid feeding device 62. Though the way to select the one set from the multiple sets is not particularly limited, one located closest to a place where a processing default of the substrates 2 occurs, and it may be appropriately updated based on an inspection result of the substrates 2. Further, an average of measurement values of the multiple sets may be used for the control of the flow rate of the processing liquid 3 by the liquid feeding device 62.

Figure 7:
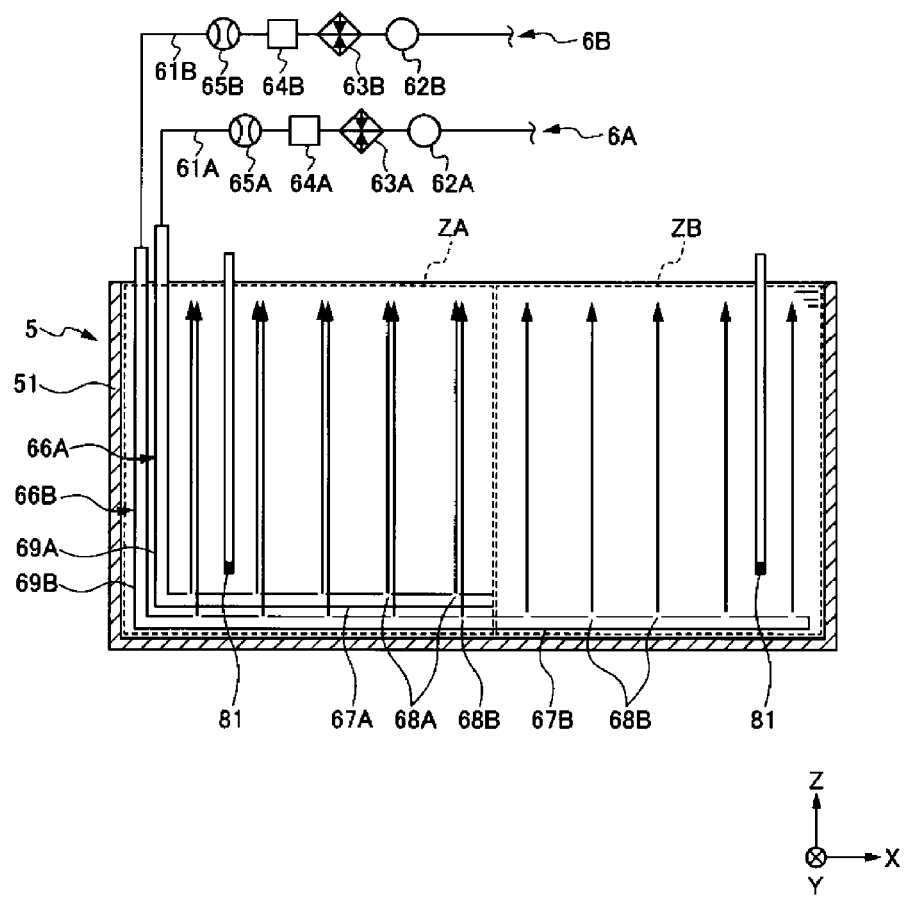
FIG. 7 is a side cross sectional view illustrating a layout of a plurality of liquid supplies according to a third modification example.

FIG. 7 is a side cross sectional view illustrating a layout of a plurality of liquid supplies according to a third modification example. Since a plan view illustrating a layout of horizontal pipes of the present modification example is the same as FIG. 2B, illustration thereof is omitted. Further, the plan view illustrating the layout of the horizontal pipes of the present modification example may be the same as FIG. 6B. Hereinafter, distinctive features of the present modification example from the above-described exemplary embodiment will be mainly explained.

In the above-described exemplary embodiment, the plurality of liquid supplies 6A and 6B are disposed so that the liquid supplies 6A and 6B do not discharge the processing liquid 3 into each of the plurality of zones ZA and ZB in duplicates. Each of the plurality of liquid supplies 6A and 6B discharges the processing liquid 3 into different one of the plurality of zones ZA and ZB. Only one liquid supply (for example, the first liquid supply 6A) discharges the processing liquid into the one and the same zone (for example, the first zone ZA).

Meanwhile, in the present modification example, both the first liquid supply 6A and the second liquid supply 6B discharge the processing liquid 3 into the first zone ZA in duplicates. However, only the second liquid supply 6B discharges the processing liquid 3 into the second zone ZB. Accordingly, the liquid supplies 6A and 6B which discharge the processing liquid 3 into the first zone ZA and the liquid supply 6B which discharges the processing liquid 3 into the second zone ZB are not completely identical, that is, different.

In the present modification example, as in the above-described exemplary embodiment, the different liquid supplies 6 discharge the processing liquid 3 into the different zones ZA and ZB. Therefore, the temperature of the processing liquid 3 can be adjusted for each of the zones ZA and ZB individually, so that the distribution of the in-tank temperature in the horizontal direction can be adjusted easily.

In the present modification example, both the first liquid supply 6A and the second liquid supply 6B discharge the processing liquid 3 into the first zone ZA in duplicates, whereas only the second liquid supply 6B discharges the processing liquid 3 into the second zone ZB as described above. Accordingly, the heating temperature setting unit 95 may first set a target value HSV of the heating temperature of the processing liquid 3 by the second heating device 63B, and set a target value HSV of the heating temperature of the processing liquid 3 by the first heating device 63A based on the target value HSV of the heating temperature of the processing liquid 3 by the second heating device 63B. Likewise, the flow rate setting unit 97 may first set a target value FSV of the flow rate of the processing liquid 3 by the second liquid feeding device 62B, and set a target value FSV of the flow rate of the processing liquid 3 by the first liquid feeding device 62A based on the target value FSV of the flow rate of the processing liquid 3 by the second liquid feeding device 62B.

Here, however, if the plurality of liquid supplies 6A and 6B are disposed not to discharge the processing liquid 3 into each of the plurality zones ZA and ZB in duplicates as in the above-described exemplary embodiment, the target value HSV of the heating temperature and the target value FSV of the flow rate can be set easily because the target values HSV and FSV can be set for each of the liquid supplies 6A and 6B independently.

Figure 8:
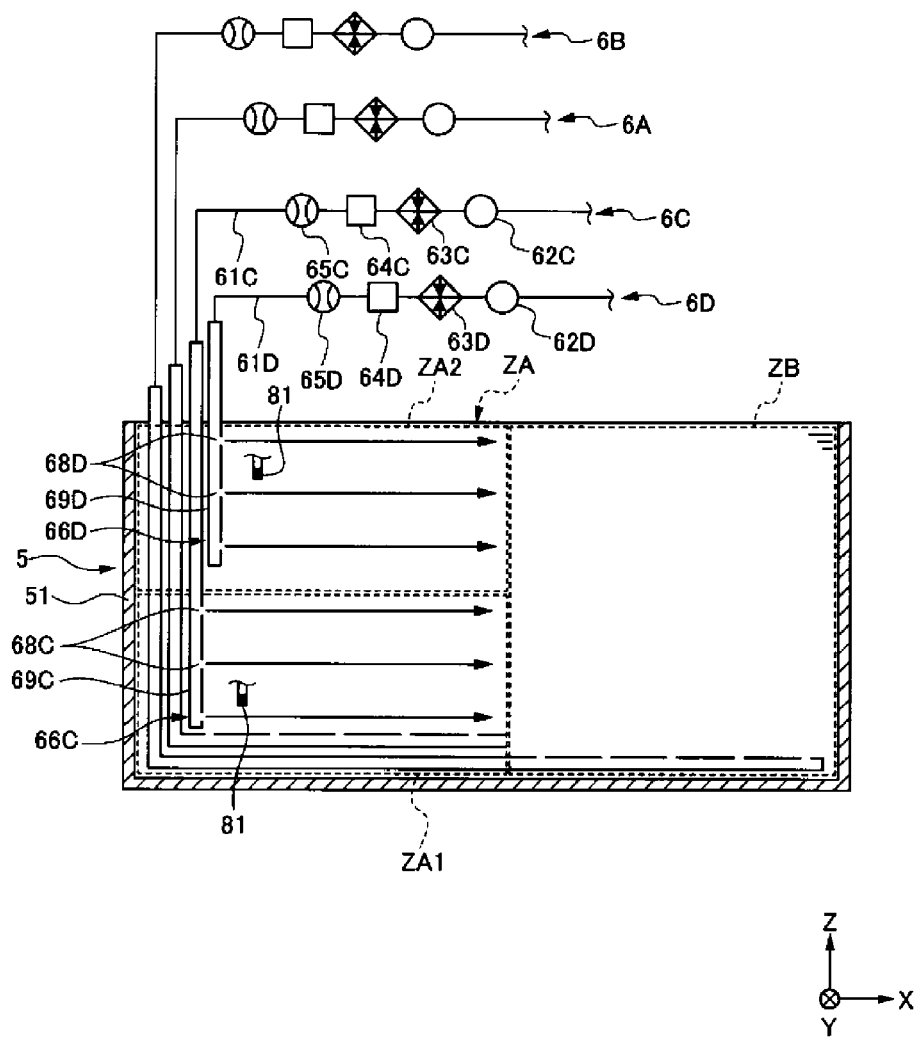
FIG. 8 is a side cross sectional view illustrating a layout of a plurality of liquid supplies according to a fourth modification example.

FIG. 8 is a side cross sectional view illustrating a layout of a plurality of liquid supplies according to a fourth modification example. Since a plan view illustrating a layout of horizontal pipes of the present modification example is the same as FIG. 2B, illustration thereof is omitted. Further, the plan view illustrating the layout of the horizontal pipes of the present modification example may be the same as FIG. 6B. Hereinafter, distinctive features of the present modification example from the above-described exemplary embodiment will be mainly explained The substrate processing apparatus 1 according to the present modification example further includes, in addition to the first liquid supply 6A and the second liquid supply 6B, a third liquid supply 6C and a fourth liquid supply 6D. Further, the substrate processing apparatus 1 may include only the third liquid supply 6C and the fourth liquid supply 6D.

In the present modification example, the inside (for example, a zone group ZA) of the water tank of the inner tub 51 is divided into multiple zones ZA1 and ZA2 in the vertical direction. The liquid supplies 6C and 6D are disposed to discharge the processing liquid 3 into the zones ZA1 and ZA2 arranged in the vertical direction, respectively.

The third liquid supply 6C includes a third supply line 61C, a third liquid feeding device 62C, a third heating device 63C, a third heating temperature sensor 64C, a third flowmeter 65C, and a third nozzle 66C. The third nozzle 66C is equipped with a vertical pipe 69C and third discharge openings 68C.

The third vertical pipe 69C is provided at an end portion within the water tank of the inner tub 51 in the arrangement direction of the substrates 2. The third vertical pipe 69C is a hollow rod extending in the vertical direction. The third vertical pipe 69C may be plural in number, and these vertical pipes 69C may be arranged at a regular distance therebetween in the Y-axis direction. The processing liquid 3 is discharged from the third discharge openings 68C in the arrangement direction of the substrates 2.

The third discharge openings 68C are provided, between the two zones ZA1 and ZA2 arranged in the vertical direction, in the zone ZA1 at a lower side, and not provided in the zone ZA2 at an upper side. That is, the third liquid supply 6C discharges the processing liquid 3 into the zone ZA1 at the lower side and does not discharge the processing liquid 3 into the zone ZA2 at the upper side.

Likewise, the fourth liquid supply 6D includes a fourth supply line 61D, a fourth liquid feeding device 62D, a fourth heating device 63D, a fourth heating temperature sensor 64D, a fourth flowmeter 65D, and a fourth nozzle 66D. The fourth nozzle 66D includes a fourth vertical pipe 69D and fourth discharge openings 68D.

The fourth vertical pipe 69D is provided at an end portion within the water tank of the inner tub 51 in the arrangement direction of the substrates 2. The fourth vertical pipe 69D is a hollow rod extending in the vertical direction. The fourth vertical pipe 69D may be plural in number, and these vertical pipes 69D may be arranged at a regular distance therebetween in the Y-axis direction. The processing liquid 3 is discharged from the fourth discharge openings 68D in the arrangement direction of the substrates 2.

The fourth discharge openings 68D are provided, between the two zones ZA1 and ZA2 arranged in the vertical direction, in the zone ZA2 at the upper side, and not provided in the zone ZA1 at the lower side. That is, the fourth liquid supply 6D discharges the processing liquid 3 into the zone ZA2 at the upper side and does not discharge the processing liquid 3 into the zone ZA1 at the lower side.

In the present modification example, as in the above-described exemplary embodiment, since different liquid supplies 6 discharge the processing liquid 3 into the zones ZA1 and ZA2 arranged in the vertical direction, the temperature of the processing liquid 3 can be adjusted for each of the zones ZA1 and ZA2 individually, so that the distribution of the in-tank temperature in the vertical direction can be adjusted easily.

One or more (one in FIG. 8) in-tank temperature sensors 81 are disposed in each of the multiple zones ZA1 and ZA2 arranged in the vertical direction. Accordingly, the distribution of the in-tank temperature in the vertical direction can be measured. Further, it is possible to adjust the heating temperature of the processing liquid 3 for each of the zones ZA1 and ZA2 individually while monitoring the in-tank temperature of the processing liquid 3.

Moreover, in the present modification example, as in the above-described exemplary embodiment, since the different liquid supplies 6 discharge the processing liquid 3 in the horizontal direction into the zones ZA1 and ZA2 which are arranged in the vertical direction, the flow rate of the processing liquid 3 can be adjusted for each of the zones ZA1 and ZA2 individually, so that the distribution of the in-tank temperature in the horizontal direction can also be adjusted.

So far, the exemplary embodiment of the substrate processing apparatus and the substrate processing method according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

Though the processing liquid 3 is the phosphoric acid aqueous solution in the above-described exemplary embodiment, the technique of the present disclosure is also applicable to a processing liquid other than the phosphoric acid aqueous solution. Any of various processing liquids may be used as long as they are capable of etching the substrates 2. By way of example, ammonia water may be used. Further, an organic solvent may be used instead of water.

Though the substrate 2 of the above-described exemplary embodiment includes the silicon wafer 21, the silicon oxide film 22 and the silicon nitride film 23, the structure of the substrate 2 is not particularly limited. By way of example, the substrate 2 may include, instead of the silicon wafer 21, a silicon carbide substrate, a gallium oxide substrate, a gallium nitride substrate, a sapphire substrate, a glass substrate or the like.

According to the exemplary embodiment, temperature controllability within the water tank of the processing tub can be improved in the batch type processing apparatus configured to process the plurality of substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing tub configured to store therein a processing liquid in which multiple substrates are to be immersed;
multiple liquid supplies including a first supply line and a second supply line through which the processing liquid is supplied to an inside of a water tank of the processing tub and a first heating device and a second heating device configured to heat the processing liquid at a portion of the first and the second supply lines; and
multiple in-tank temperature sensors configured to measure a temperature of the processing liquid at multiple positions within the water tank of the processing tub,
wherein the inside of the water tank of the processing tub is divided into multiple zones, the multiple zones are arranged in an arrangement direction of the multiple substrates, and the multiple liquid supplies are arranged to discharge the processing liquid into the multiple zones, respectively, and
one or more of the in-tank temperature sensors are disposed in each of the multiple zones which are arranged in the arrangement direction of the multiple substrates,
wherein the arrangement direction is a direction in which the multiple substrates are arranged in the processing tub, wherein the multiple zones include a first zone and a second zone, the first zone including a first group of the multiple substrates and the second zone including a second group of the multiple substrates, wherein the first zone includes a first processing condition and the second zone includes a second processing condition, the first and second processing conditions being different and individually controlled.

2. The substrate processing apparatus of claim 1, wherein in at least one of the multiple zones arranged in a horizontal direction, the multiple in-tank temperature sensors are disposed to be distanced away from each other in a vertical direction.

3. The substrate processing apparatus of claim 2, further comprising:
a heating temperature setting unit configured to calculate a distribution of an in-tank temperature of the processing tub based on measurement values of the multiple in-tank temperature sensors, and set a target value of a heating temperature of the processing liquid by the first heating device and the second heating device based on the calculated distribution; and
a heating controller configured to control an output of the first heating device and the second heating device based on the target value of the heating temperature.

4. The substrate processing apparatus of claim 1, further comprising:
a heating temperature setting unit configured to calculate a distribution of an in-tank temperature of the processing tub based on measurement values of the multiple in-tank temperature sensors, and set a target value of a heating temperature of the processing liquid by the first heating device and the second heating device based on the calculated distribution; and
a heating controller configured to control an output of the first heating device and the second heating device based on the target value of the heating temperature.

5. The substrate processing apparatus of claim 4, wherein the heating temperature setting unit sets the target value of the heating temperature for each of the liquid supplies individually.

6. The substrate processing apparatus of claim 4, wherein each of the multiple liquid supplies comprises a heating temperature sensor configured to measure a temperature of the processing liquid at a downstream of the first heating device and the second heating device, and
the heating controller controls the output of the first heating device and the second heating device based on a deviation between the target value of the heating temperature and a measurement value of the heating temperature sensor.

7. The substrate processing apparatus of claim 1, wherein the first supply line or the second supply line is a circulation line through which the processing liquid overflown from the water tank of the processing tub is returned back into the water tank of the processing tub.

8. The substrate processing apparatus of claim 1, wherein each of the multiple liquid supplies comprises:
a liquid feeding device configured to send the processing liquid in the first supply line or the second supply line; and
a liquid feeding controller configured to control an output of the liquid feeding device.

9. The substrate processing apparatus of claim 8, further comprising:

a flow rate setting unit configured to calculate a distribution of an in-tank temperature of the processing tub based on measurement values of the multiple in-tank temperature sensors, and set a target value of a flow rate of the processing liquid by the liquid feeding device based on the calculated distribution,
wherein the liquid feeding controller controls the output of the liquid feeding device based on the target value of the flow rate.

10. The substrate processing apparatus of claim 1, wherein the inside of the water tank of the processing tub is divided into the multiple zones in a vertical direction, and the multiple liquid supplies are disposed such that different liquid supplies discharge the processing liquid into the multiple zones, respectively.

11. A substrate processing method, comprising:
storing, in a processing tub, a processing liquid in which multiple substrates are to be immersed;
supplying the processing liquid to an inside of a water tank of the processing tub by multiple liquid supplies including a first supply line and a second supply line;
heating the processing liquid at a portion of the first supply line via a first heating device and the second supply line via a second heating device; and
measuring a temperature of the processing liquid at multiple positions within the water tank of the processing tub by multiple in-tank temperature sensors and calculating a distribution of an in-tank temperature,
wherein the inside of the water tank of the processing tub is divided into multiple zones, the multiple zones are arranged in an arrangement direction of the multiple substrates, and the multiple liquid supplies are arranged to discharge the processing liquid into the multiple zones, respectively, and
one or more of the in-tank temperature sensors are disposed in each of the multiple zones which are arranged in the arrangement direction of the multiple substrates,
wherein the arrangement direction is a direction in which the multiple substrates are arranged in the processing tub,
wherein the multiple zones include a first zone and a second zone, the first zone including a first group of the multiple substrates and the second zone including a second group of the multiple substrates,
wherein the first zone includes a first processing condition and the second zone includes a second processing condition, the first and second processing conditions being different and individually controlled.

12. The substrate processing method of claim 11, further comprising:
adjusting a heating temperature of the processing liquid supplied at the multiple positions within the water tank of the processing tub such that a deviation between the calculated distribution and a target distribution thereof becomes zero.

13. The substrate processing method of claim 12, further comprising:
correcting a target value of the heating temperature of the processing liquid such that the deviation between the calculated distribution and the target distribution thereof becomes zero, and controlling an output of the first heating device and the second heating device configured to heat the processing liquid such that a deviation between the corrected target value and a measurement value becomes zero.

14. The substrate processing method of claim 11, further comprising:

adjusting a flow rate of the processing liquid supplied at the multiple positions within the water tank of the processing tub such that a deviation between the calculated distribution and a target distribution thereof becomes zero.

15. The substrate processing method of claim 14, further comprising:

correcting a target value of the flow rate of the processing liquid such that the deviation between the calculated distribution and the target distribution thereof becomes zero, and controlling an output of a liquid feeding device configured to send the processing liquid such that a deviation between the corrected target value and a measurement value becomes zero.

16. The substrate processing apparatus of claim 1, wherein the processing liquid supplied by the first supply line is at a different temperature that the processing liquid supplied by the second supply line.

* * * * *